(12) United States Patent
Avery et al.

(10) Patent No.: US 7,219,278 B2
(45) Date of Patent: *May 15, 2007

(54) CONFIGURATOR ARRANGEMENT AND APPROACH THEREFOR

(75) Inventors: Daniel Lee Avery, Chandler, AZ (US); Michael J. Smith, Chandler, AZ (US); Joel Patrick Bailey, Chandler, AZ (US); Randall Pendley, Tempe, AZ (US)

(73) Assignee: NXP B.V., Eindhoven (NL)

( * ) Notice: Subject to any disclaimer, the term of this patent is extended or adjusted under 35 U.S.C. 154(b) by 269 days.

This patent is subject to a terminal disclaimer.

(21) Appl. No.: 10/796,484

(22) Filed: Mar. 8, 2004

(65) Prior Publication Data

US 2004/0193980 A1    Sep. 30, 2004

(51) Int. Cl.
*G01R 31/28* (2006.01)
*H04L 12/26* (2006.01)
(52) U.S. Cl. ...................... 714/724; 370/251
(58) Field of Classification Search ............. None
See application file for complete search history.

(56) References Cited

U.S. PATENT DOCUMENTS 6,425,101 B1 * 7/2002 Garreau ................ 714/727
6,587,979 B1 * 7/2003 Kraus et al. ............ 714/720
6,697,967 B1 * 2/2004 Robertson .............. 714/43
6,834,366 B2 * 12/2004 Kim et al. .............. 714/734

\* cited by examiner

*Primary Examiner*—Christine T. Tu
(74) *Attorney, Agent, or Firm*—Peter Zawilski

(57) ABSTRACT

A circuit testing approach involves configurable switch control for automatically detecting and routing test signals along a plurality of test circuit paths. According to an example embodiment of the present invention, a configurator arrangement (100) is programmed to control a configured circuit (110), the control including automatically setting switches (115) on the configured circuit. In one implementation, the configurator arrangement is programmed to automatically detect test signals (i.e., digital and/or JTAG test signals) and to control switches (115) for routing test data along a test circuit path. With this approach, manual switching for routing the test signals is not necessary, which has been found to be useful in applications where access to the circuit paths for switching is difficult or impossible. In another implementation, a communications link (130) passes signals between the configurator arrangement and a user interface (140), including control signals from the user interface and data from the configured circuit. The configurator arrangement (100) is further controllable (i.e., manually) or programmable by signals received from the user interface (140).

17 Claims, 8 Drawing Sheets

CONFIGURATOR ARRANGEMENT AND APPROACH THEREFOR

FIELD OF THE INVENTION

The present invention relates generally to testing electrical circuits and, more particularly, to electrical circuit testing methods and arrangements such as used in connection with IEEE JTAG (Joint Test Access Group) standards.

BACKGROUND

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, manufacturing and testing processes become more difficult.

A wide variety of techniques have been used in electronic circuit devices to ensure that, once they are manufactured, they operate fully in compliance with their intended design and implementation specifications. Many of the more complex circuit designs include circuits that permit in-circuit testing via access pins. The IEEE 1149.1 JTAG recommendation, for example, provides test circuit architecture for use inside such circuits. This architecture includes a test access port (TAP) controller coupled to the pins for providing access to and for controlling various standard features designed into such circuits. Some of these features are internal scan, boundary scan, built-in test and emulation.

For a variety of implementations, different circuit paths are tested using the JTAG recommendation, depending upon the type of test being performed. Mechanical connections (i.e., jumpers) have typically been used to select such a desired circuit path for JTAG-type testing. Setting mechanical connections, however, typically requires access to the connections being set. For example, circuit modules (e.g., permanent and/or reusable blocks, circuit tiles and integrated circuits) can be stacked on top of one another, such that in setting jumpers the circuit modules must be pulled apart. If mistakes are made in setting the jumpers, the process of pulling apart the modules and setting the jumpers must be repeated. The implementation of this mechanical connection-setting approach has been challenging. For example, taking apart modules for making connections involves a risk of damaging the connectors, boards and/or other circuitry involved therewith.

Current JTAG and other circuit testing approaches have typically been limited to the testing of powered circuits. For instance, typical diagnostic testing involves the passage of test signals after power-up of the circuit being tested, with the test signals passing through circuits during the operation thereof. Therefore, JTAG and other circuit testing approaches typically have not been used for testing circuits prior to power-up.

In addition, for many chip designs, customized chips are made by describing their functionality using a hardware-description language (HDL), such as Verilog or VHDL. The hardware description is often written to characterize the design in terms of a set of functional macros. The design is computer simulated to ensure that the custom design criteria are satisfied. For highly-complex custom chip designs, the above process can be burdensome and costly. The highly integrated structure of such chips leads to unexpected problems, such as signal timing, noise-coupling and signal-level issues. Consequently, such complex custom chip designs involve extensive validation. This validation is generally performed at different stages using a Verilog or VHDL simulator. Once validated at this level, the Verilog or VHDL HDL code is synthesized, for example, using "Synopsis," to a netlist that is supplied to an ASIC (Application Specific Integrated Circuit) foundry for prototype fabrication. The ASIC prototype is then tested in silicon. Even after such validation with the Verilog or VHDL simulator, unexpected problems are typical. Overcoming these problems involves more iterations of the above process, with testing and validation at both the simulation and prototype stages. Such repetition significantly increases the design time and cost to such a degree that this practice is often intolerable in today's time-sensitive market.

These and other difficulties present challenges to the design and testing for a variety of applications.

SUMMARY

Various aspects of the present invention involve testing approaches for a variety of integrated circuits, such as those including memory circuits and others. The present invention is exemplified in a number of implementations and applications, some of which are summarized below.

According to one example embodiment of the present invention, a programmable configurator arrangement is programmed to route test signals via a selected circuit path on configurable circuit using automatically set switches. The configurator is coupled to a user interface for accepting control inputs for setting the switches. In one implementation, the switches are set in response to test signals being detected at an input node of the configurable circuit. With this approach, switching for test data routing is automatically effected, without necessarily involving manual switching approaches, such as those involving the use of jumpers.

In a more particular example embodiment of the present invention, the configurator discussed in the preceding paragraph includes a microcontroller programmed using stored software and/or information received from the user interface by way of a communications link. In one implementation, the software is sent from the user interface to program memory coupled to the microcontroller (i.e., by way of a bus), with updates to the software being made with the user interface. The microcontroller is further configured to monitor characteristics of the configurable circuit and to send information regarding the monitored characteristics to the user interface by way of the communications link. Characteristics that are monitored include, for example, switch settings, clock frequencies, connectivity (e.g., between the configurable circuit and other configurable circuits), board voltages, JTAG operations and diagnostic characteristics. In another implementation, the microcontroller is controlled by the user interface for detecting characteristics of the configurable circuit prior to power-lip of the configurable circuit, which is useful, for instance, in performing diagnostics before operating the configurable circuit.

The microcontroller is programmed to automatically monitor test data inputs (TDIs) on the configurable circuit for testing signals. Upon the detection of a test signal (e.g., a JTAG test signal), the programmed microcontroller identifies a particular circuit path to which the test data is to be routed, and controls switches for routing the test signal between the TDIs and the circuit path. In a more particular implementation, the microcontroller is further programmed to control a switch for routing a response to the test signal to a test data output (TDO). In another more particular implementation, the microcontroller is further controllable using the user interface to control the switches (e.g., to override the programming and manually control the switches).

In another example embodiment of the present invention, an inter-connectable circuit board includes a plurality of circuit paths and controllable switches adapted for routing test data between at least one of the circuit paths and a communications node. A server arrangement including program memory and a microcontroller on the inter-connectable circuit board is programmed for controlling the controllable switches using stored programming information in the memory. In response to detecting a test signal at the communications node, software in the program memory controls the microcontroller to identify a particular one of the circuit paths to which the test signal is to be routed. The microcontroller then controls the controllable switches to couple a signal path between the communications node and the circuit path. With this approach, access to the inter-connectable circuit board, for example, for connecting jumper lines for switching circuits, is not necessary. This approach has also been found useful when the inter-connectable circuit board is connected to another arrangement such that physical access to the inter-connectable circuit board is difficult or not possible.

The above summary of the present invention is not intended to describe each embodiment or every implementation of the present invention. The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
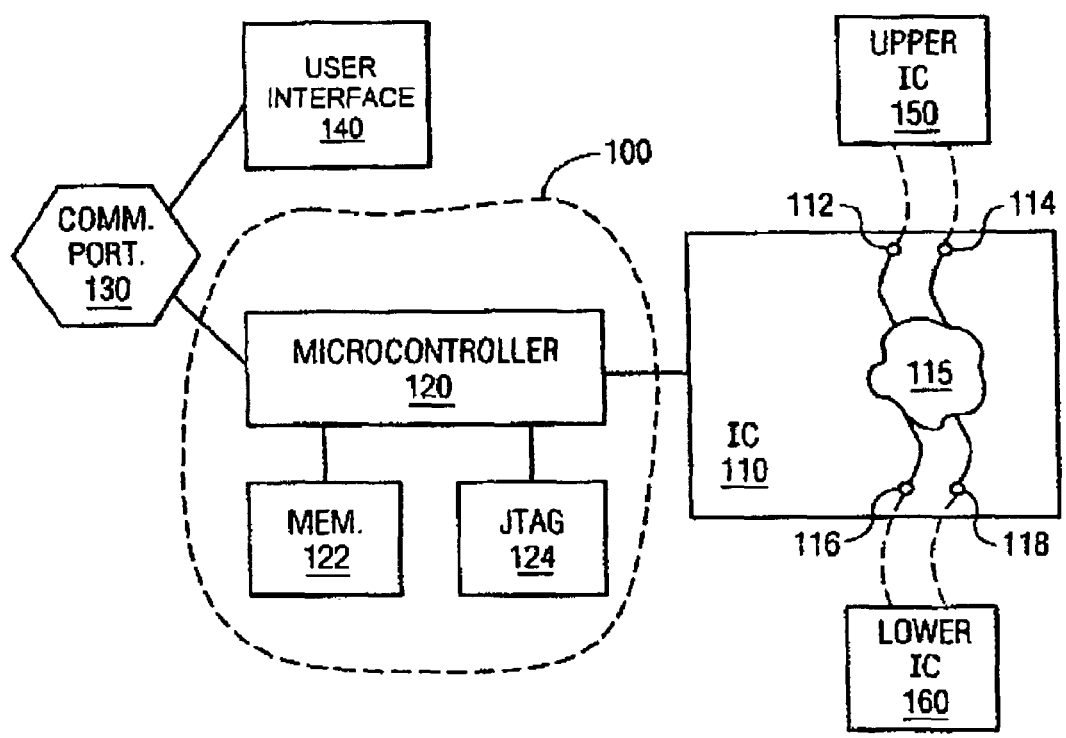
FIG. 1 is a circuit arrangement adapted for controlling the hardware configuration of an integrated circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION

The present invention is believed to be applicable to a variety of circuits and approaches involving and/or benefiting from testing, and in particular to testing involving approaches such as JTAG and digital signal testing (i.e., using digital signal protocols) and the configuration thereof. While the present invention is not necessarily limited to such applications, an appreciation of various aspects of the invention is best gained through a discussion of examples in such an environment.

According to an example embodiment of the present invention, a configurator arrangement is coupled to a configurable circuit and programmed to switch circuit paths in the configurable circuit for passing test signals. A communications link communicates control signals between a user interface and the configurator arrangement. The configurator arrangement controls test signal path switching circuits of the configurable circuit using the control signals and/or programming information stored at the configurator arrangement. In one implementation, the test signal path switching circuits are manually switched in response to control signals from the user interface. In another implementation, the configurator arrangement monitors signals in the configurable circuit and automatically switches the test signal path switching circuits. Test signals are then delivered to and/or from a specific circuit that is on the configurable circuit and/or coupled to the configurable circuit (e.g., on a separate circuit board). With these approaches, physical routing (i.e., the switching of jumper wires) is not necessary for delivering test signals to different circuits, and switches on the configurable circuit are remotely controllable with a user interface.

In another example embodiment of the present invention, the configurator arrangement discussed in the preceding paragraph includes a microcontroller that is part of a reusable inter-connectable testing circuit including one or more devices, such as I/O, memory, DSP, power supply and RISC CPU devices. The inter-connectable testing circuit is also adapted for coupling to other circuits, for example, for arranging prototype circuit designs and architectures for testing purposes. When testing such a prototype arrangement, testing signals need to be coupled to various elements, circuit paths and/or other inter-connectable testing circuits. In this regard, the microcontroller is adapted for controlling switches on a particular inter-connectable testing circuit for routing test signals thereon. With this approach, the routing of the test signals is automatic, which has also been found useful in implementations where the inter-connectable circuits are coupled in a stacked prototype arrangement (i.e., where access to the circuits is limited).

In another example embodiment of the present invention, a hardware configurator (i.e., a microcontroller) is disposed on a circuit module and programmed to monitor testing signals for routing on the circuit module using interrupt and initialization routines. The hardware configurator is programmable with the user interface and controls a plurality of switches on the circuit module in response to the monitored testing signals and/or inputs received from the user interface. In one implementation, one or more of JTAG-type TDI (test data in) and TDO (test data out) signals from various input pins on the circuit board are coupled to connectors on the hardware configurator and monitored using interrupts. Each of the signals is tied to a specific interrupt of the hardware configurator, with the hardware configurator being programmed with an interrupt routine for each of the signals. When the interrupt occurs, the programmed hardware configurator routes the proper path for the particular type of signal (i.e., as directed by the IEEE 1149.1 JTAG recommendation discussed above) using the switches. In various other implementations, other signals such as Test Clock (TCK) signals, Test Mode Select (TMS) and boundary-scan signals are also passed on and/or to and from the circuit module.

In another example embodiment of the present invention, a prototyping approach involves the use of a plurality of interchangeable circuits, each interchangeable circuit having a microcontroller and a switch that route test data and are controllable with a user interface coupled to the microcontroller. The microcontroller and switch may, for example, include one or more of the microcontroller/switch arrangements discussed herein. Each interchangeable circuit includes test data input (TDI) and test data output (TDO) nodes, with data being routed through test circuit paths in the interchangeable circuit under the control of the microcontroller. Also on each interchangeable circuit is a communications port for coupling to a user interface, either directly or through other interchangeable circuits, for inputting control signals for the microcontroller (e.g., for storing programming instructions and/or manually controlling a switch arrangement). Each of the interchangeable circuits is coupled to one or more programmable circuits, devices and/or functional blocks used for emulating a particular circuit design. For instance, circuit devices such as an FPGA (field-programmable gate array) device, an FPGA plug-in board, an expansion board and/or an external circuit communicatively coupled to the interchangeable circuit are used in various instances. These approaches have been found useful, for example, for circuit board development and as a support tool for silicon-on-chip platforms. The interchangeable circuits may be implemented, for example, in a manner such as discussed in U.S. application Ser. No. 10/016,731, entitled "Method and Arrangement for Rapid Silicon Prototyping" and filed on Dec. 11, 2001, which is a continuation of U.S. Pat. No. 6,347,395 (VLSI.206PA), entitled "Method and Arrangement for Rapid Silicon Prototyping" and filed on Dec. 18, 1998, both of which are fully incorporated herein by reference.

FIG. 1 shows a configurator system 100 for monitoring and controlling an integrated circuit (IC) 110 (e.g., or other configurable circuit), according to another example embodiment of the present invention. The configurator system 100 includes a microcontroller 120 coupled between the IC 110 and a user interface 140, with an RS232 communications port 130 coupled between the user interface and the microcontroller. A memory 122 and a JTAG controller 124 are also coupled to the microcontroller and respectively used for storing JTAG program information and controlling JTAG signals for the IC 110, in response to inputs received through the, RS232 port 130.

User inputs at the user interface 140 sent through the RS232 port 130 to the microcontroller 120 where they can be stored at the memory 122 and/or immediately used for execution, for example, using the JTAG controller 124 to control JTAG operations in the IC 110. JTAG signal path switches 115 on the IC 110 route data within the IC and/or to and from circuits coupled to the IC, and are optionally part of the configurator system 100. These JTAG signal path switches 115 are manually switchable using the user interface 140 and automatically switchable using programmed information stored at the memory 122. In one implementation, general-purpose input output (GPIO) controls, located in the microcontroller 120 and/or coupled to the microcontroller are used for controlling the JTAG signal path switches 115. For general information regarding ICs and JTAG-type approaches, and for specific information regarding approaches to automatic switching for JTAG routing that may implemented in connection with the present invention, reference may be made to U.S. Provisional Patent Application Ser No._____ (US030051P/VLSI.379P1), filed on Mar. 4, 2003, entitled "Testing Circuit and Approach Therefor" and fully incorporated herein by reference.

In one implementation, the IC 110 is coupled to one or more other similar ICs. For example, upper input and output pins 112 and 114, respectively, can be coupled to an upper IC 150 for communicating JTAG test signals. Test signals from the upper IC 150 are routed to the IC 110 through input pin 112, passed through JTAG test paths on the IC 110 and routed back to the upper IC through output pin 114. In this example, the RS232 130 is coupled to the user interface 140 by way of an RS232 port on the upper IC 150. Optionally, the RS232 130 is coupled directly to the user interface 140, with the RS232 on the upper IC being coupled directly and/or though the RS232 port 130 to the user interface 140. The routing of the JTAG test signals is accomplished using the JTAG signal path switches 115 on the IC 110, as discussed above, using control inputs from the user interface 140 and/or stored programming at the memory 122. For instance, a user at the user interface 140 can issue a command that cuts off signals to and/or from the upper IC 150, or otherwise control the routing of JTAG signals on the IC 110 between the IC 110 and other circuits. In addition, the microcontroller 120 is also optionally adapted for controlling JTAG signal path switches on the upper IC 150, using the JTAG controller 124 and routing control signals through input and/or output pins 112 and 114.

In another example, a lower IC 160 is coupled to the IC 110 at lower output and input pins 116 and 118, respectively, using an approach similar to that discussed above in connection with the upper IC 150. The lower IC 160 is also coupled to the user interface 140, either by way of an RS232 port on the lower IC or through the RS232 port on the IC 110. In one instance, both the upper and lower ICs 150 and 160 are respectively coupled to the IC 110. Inputs received at upper input pin 112 are routed through JTAG signal paths on the IC 110 and out the lower output pin 116 to the lower IC 160 using the JTAG signal path switches 115. Outputs from the lower IC 160, responsive to the JTAG signals received from the output pin 116, are routed to the input pin 118 and, using the JTAG signal path switches 115, back to the upper IC 150 by way of output pin 114. Responses to the JTAG signals from one or all of the ICs 110, 150 and 160 can be routed to the user interface 140.

The microcontroller 120 is implemented for monitoring the IC 110 during both operational and non-operational modes thereof. Data regarding monitored circuits in the IC 110 is sent through the RS232 port 130 to the user interface 140, where users can monitor aspects of the IC 110. In addition to the monitoring of JTAG signals and responses as discussed above, a variety of characteristics of the IC 110 can be monitored using the microcontroller 120. For instance, prior to power-up of the IC 110, characteristics of the IC 110 are tested for diagnostics or other purposes. Proper connectivity between circuit modules (e.g., JTAG modules) and other ICs coupled to IC 110, as well as the operation of the IC 110 can thus be tested before use of the IC. In other instances, characteristics such as clock frequencies (e.g., using timers) and voltages of the IC 110 (e.g., using an analog-to-digital converter (ADC)) are monitored with the microcontroller 120. These characteristics can then be passed through the RS232 port 130 to a user at the user interface 140.

Various ones of the elements shown in FIG. 1 are implemented using a variety of approaches, for example, depending upon the available equipment, type of signals being passed and desired functionality. For instance, the user interface 140 includes one or more of a variety of graphical and non-graphical user interfaces that facilitate two-way communication between the user interface and the microcontroller 120. A variety of user input devices, such as keyboards, pointing devices and touch screens may thus be implemented in connection with the user interface 140. Similarly, the RS232 communications link 130 is replaced with other suitable communications links, such as a USB link, wireless and/or wired links and others. Also, a variety of types of memory may be used in addition to or as the memory 122, such as FLASH and/or SRAM memory. Communications between these and other components in the configurator system 100 are also optionally effected using a bus controller in the IC 110, such as a I2C bus controller, to which the microcontroller 120, memory 122, JTAG controller 124 and RS232 portion 130 can be coupled.

FIGS. 2–7 show several approaches that may be implemented in connection with circuits discussed herein, such as those discussed above in connection with FIG. 1 (i.e., the microcontroller 120 can be programmed using these approaches). Various ones of these approaches are separately applicable in connection with different example embodiments of the present invention. In addition, these approaches may be implemented together, with operation of a configurator following the figures; the discussion of FIGS. 2–7 below follows this approach.

Figure 2:
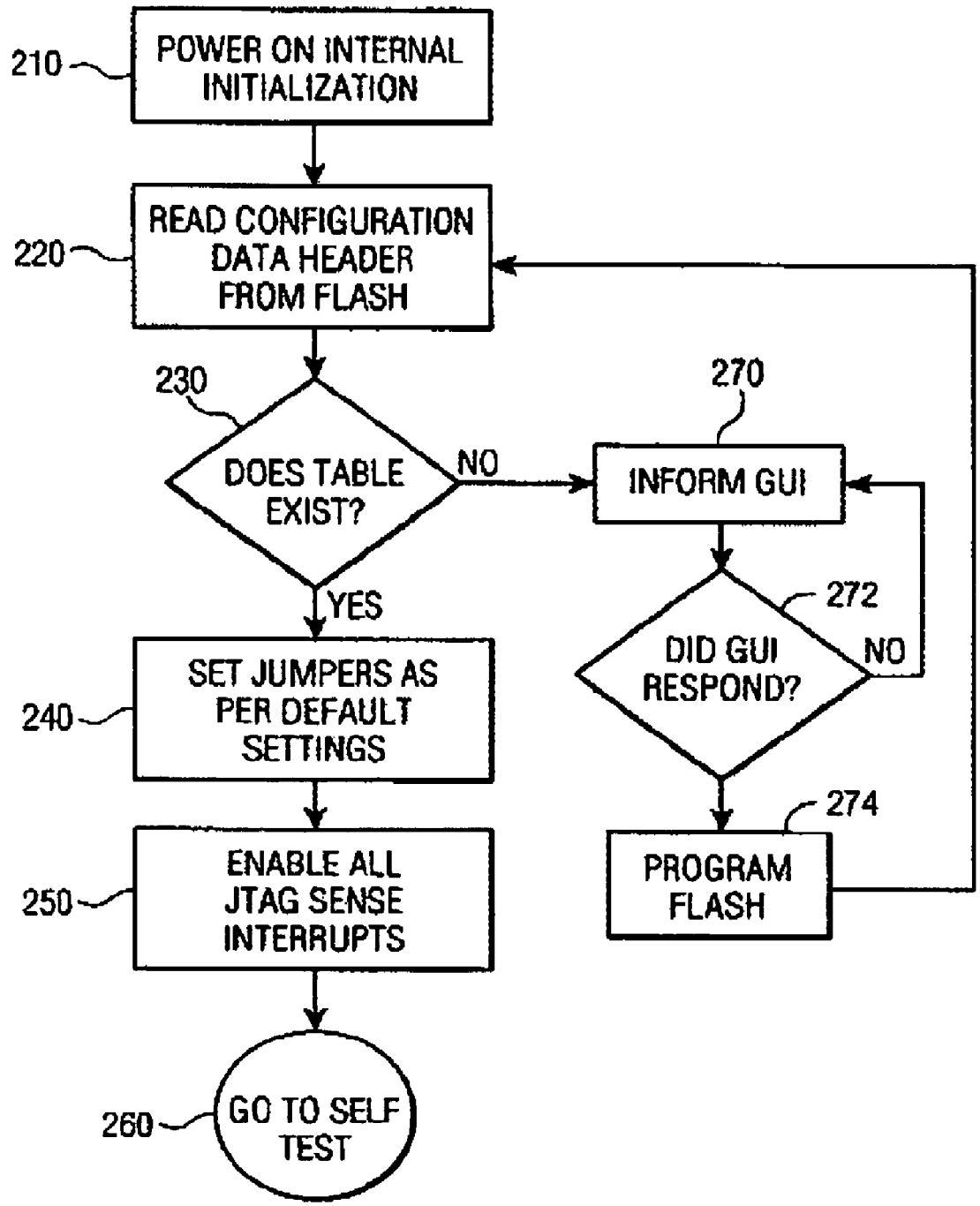
FIG. 2 is a flow diagram for a power-up step of a hardware configuration approach, according to another example embodiment of the present invention.

Referring to FIG. 2, a configurator server is powered for initialization in connection with another example embodiment of the present invention. At block 210, an internal initialization is carried out for a configurator server arrangement. A configuration data header is read from FLASH memory at block 220, and if a programming table (for use in controlling JTAG signals on the IC) does not exist at node 230, a graphic user interface (GUI) device is informed at block 270. If the GUI responds at node 272, the FLASH memory is programmed with the response at block 274. If the GUI does not respond at node 272, the GUI is re-informed at block 270, with the process at block 270 and node 272 being repeated (e.g., at a selected time interval or with a continuous display at the GUI) until a response is received. After the FLASH is programmed, the process continues again at block 220. Once a table is found to exist at node 230, jumpers (e.g., JTAG signal path switches) are set at block 240, all JTAG sense inputs for detecting JTAG signals are enabled at block 250, and a self-test (FIG. 3) is begun at node 260.

Figure 3:
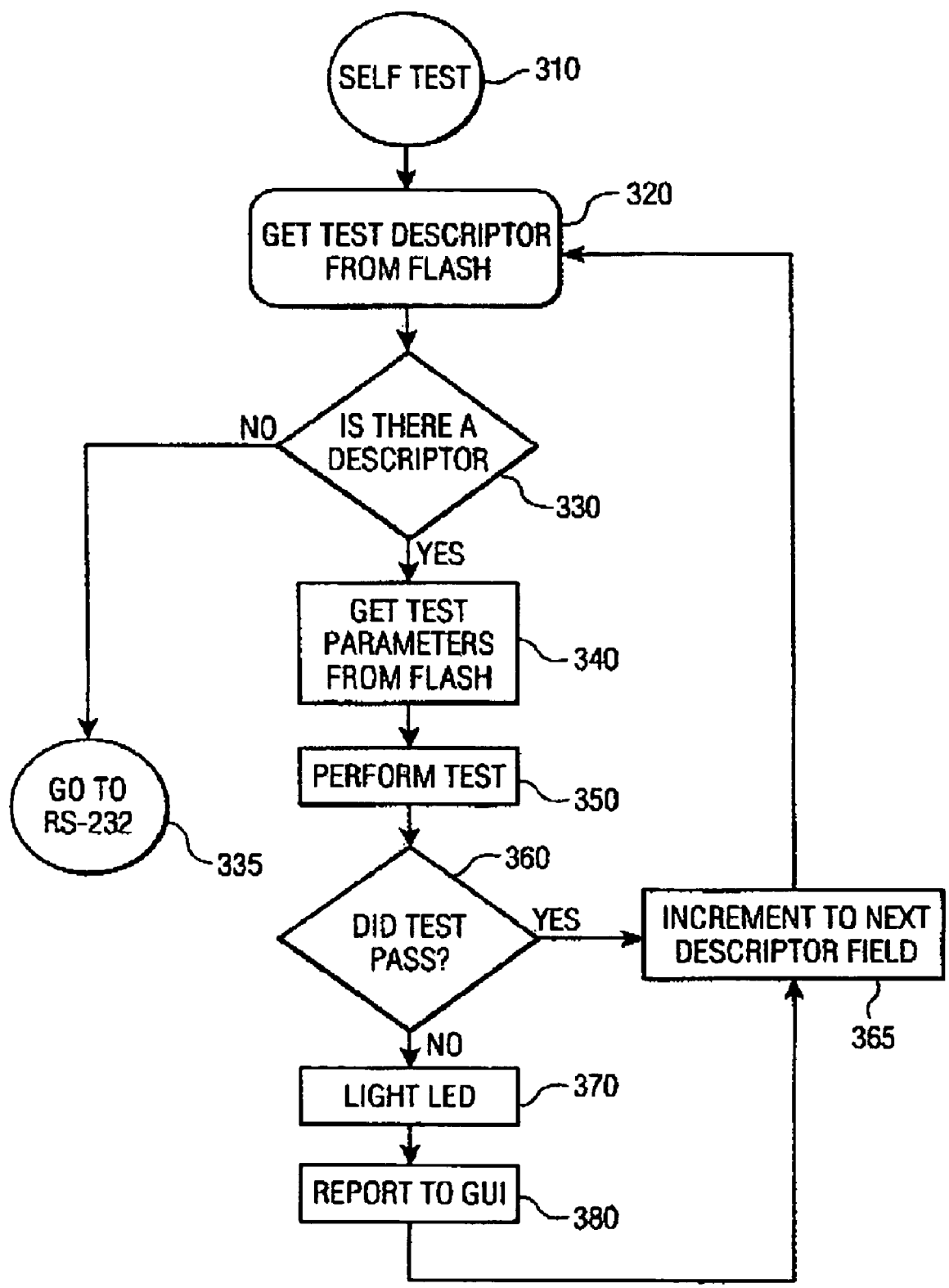
FIG. 3 is a flow diagram for a self-test step of a hardware configuration approach, according to another example embodiment of the present invention.

FIG. 3 shows a self-test approach, according to another example embodiment of the present invention. The self-test is initiated at node 310, with a test descriptor being obtained from FLASH memory at block 320. If a descriptor is not present at node 330, an RS-232 port is queried at node 335, as discussed further in connection with FIG. 4 to obtain a descriptor. Once a descriptor is available, test parameters are retrieved from FLASH memory at block 340, and a test is performed at block 350 (e.g., a connectivity or clock frequency test). If the test fails at node 360, an LED is lit at block 370 and the GUI is informed at block 380. If the test passes at node 360, or after the GUI has been informed at block 380, an increment is made to a next descriptor field at block 365 (e.g., for performing additional tests), and the process continues at block 320 until tests in the FLASH have been performed. Referring again to FIG. 1, this approach can be implemented for testing the IC 110 using information stored at the memory 122 (e.g., implemented as the FLASH memory discussed above).

Figure 4:
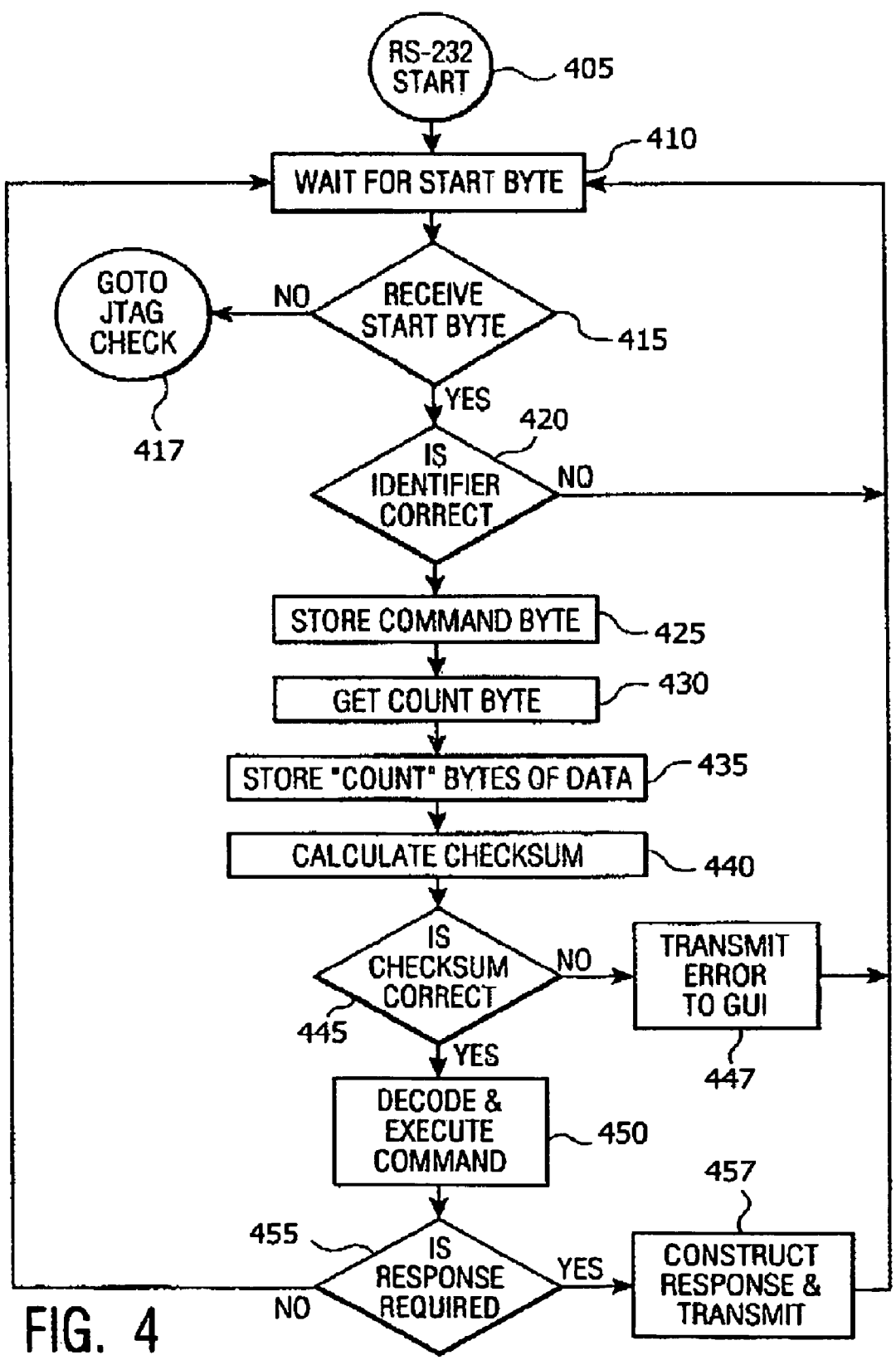
FIG. 4 is a flow diagram for a communications step of a hardware configuration approach, according to another example embodiment of the present invention.

FIG. 4 shows an approach for communicating with an RS-232 port at a JTAG hardware configurator, according to another example embodiment of the present invention. At node 405, RS-232 communications are started, with the process beginning by waiting for a start byte at block 410. If a start byte is not received at node 415, a JTAG signal check is performed at node 417 (e.g., in connection with FIG. 6, discussed below). When a start byte is received at block 415, an identifier is checked at node 420, and if incorrect, the process resumes at block 410. If the identifier is correct at node 420, a command byte received through the RS-232 port is stored at block 425, a count byte is accessed at node 430 and used for storing bytes of data at node 435 having a length set by the count byte. A checksum is calculated at block 440 to detect that the proper bytes have been received, and if the checksum is incorrect at node 445, an error is transmitted to the GUI at block 447,and the process resumes at node 410. If the checksum is correct at node 445, the command (bytes of data) is decoded and executed at node 450. If a response is required at node 455, a response is constructed and transmitted at node: 457. The process then returns to node 410. With this approach, control signals from a remote GUI can be implemented for controlling a hardware configurator arrangement, such as the arrangement 100 in FIG. 1.

Figure 5:
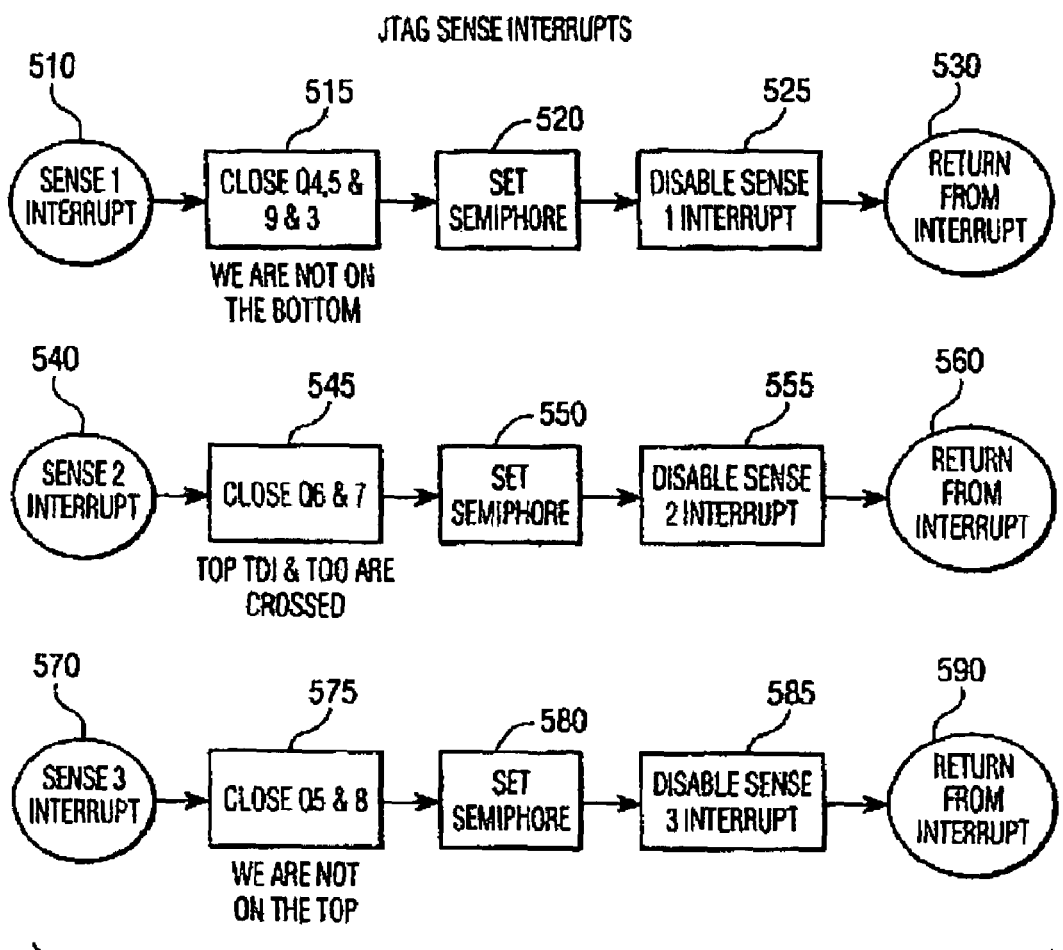
FIG. 5 is a flow diagram for a JTAG interactive configuration detection step of a hardware configuration approach, according to another example embodiment of the present invention.

FIG. 5 is an approach for detecting the position of a JTAG-compatible circuit, relative to other JTAG-compatible circuits coupled thereto in a stacked arrangement, according to another example embodiment of the present invention. This approach may, for example, be implemented in connection with the stackable prototype circuit shown in FIG. 8 and discussed further below. By way of example, FIG. 5 is discussed in connection with the circuit shown in FIG. 8. At node 510, a first sense interrupt routine for test node 836 is begun, with switches 803, 804, 805 and 809 being closed at block 515 in response to no signal being detected at test node 836. At block 520, a first semiphore (e.g., a software flag or indicator light) is set, and a JTAG signal sense interrupt coupled to test node 832 is disabled at block 525, with the first sense interrupt routine ending at node 530.

At node 540, a second sense interrupt routine for test node 832 is begun, showing signals at test nodes 830 and 832 having been discovered as being crossed. At block 545, switches 806 and 807 are closed in response, a semiphore is set at block 550, a sense interrupt for test node 832 is disabled and the second sense interrupt routine is ended at node 560.

At node 570, a third sense interrupt routine is initiated, where no test signals are detected from an upper JTAG-compatible circuit. At block 575, switches 805 and 808 are closed, a semiphore is set at block 580, a sense interrupt for test node 830 is disabled at block 585 and the interrupt routine ends at node 590.

Figure 6:
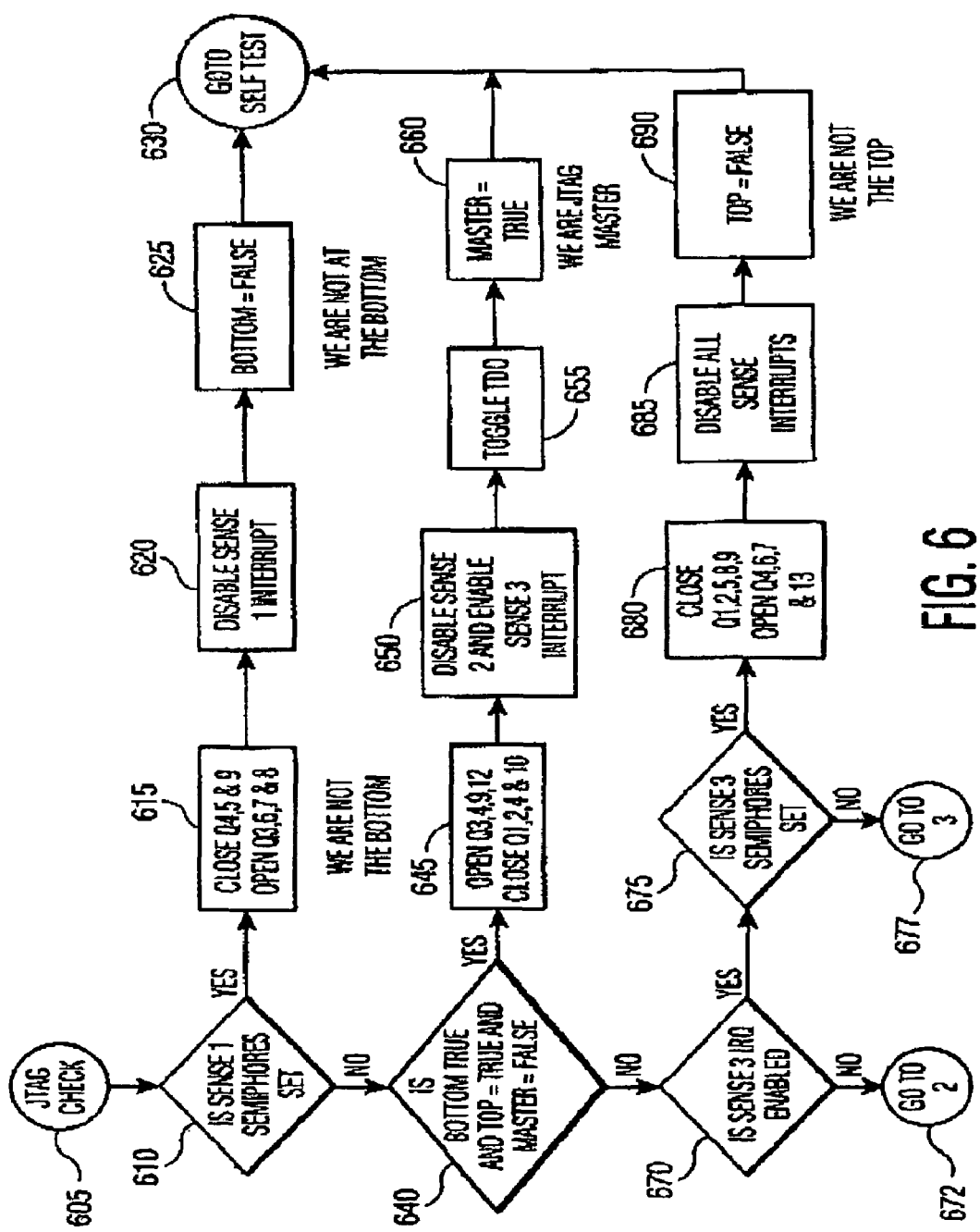
FIG. 6 is a flow diagram for a JTAG signal detection step of a hardware configuration approach, according to another example embodiment of the present invention.
Figure 7:
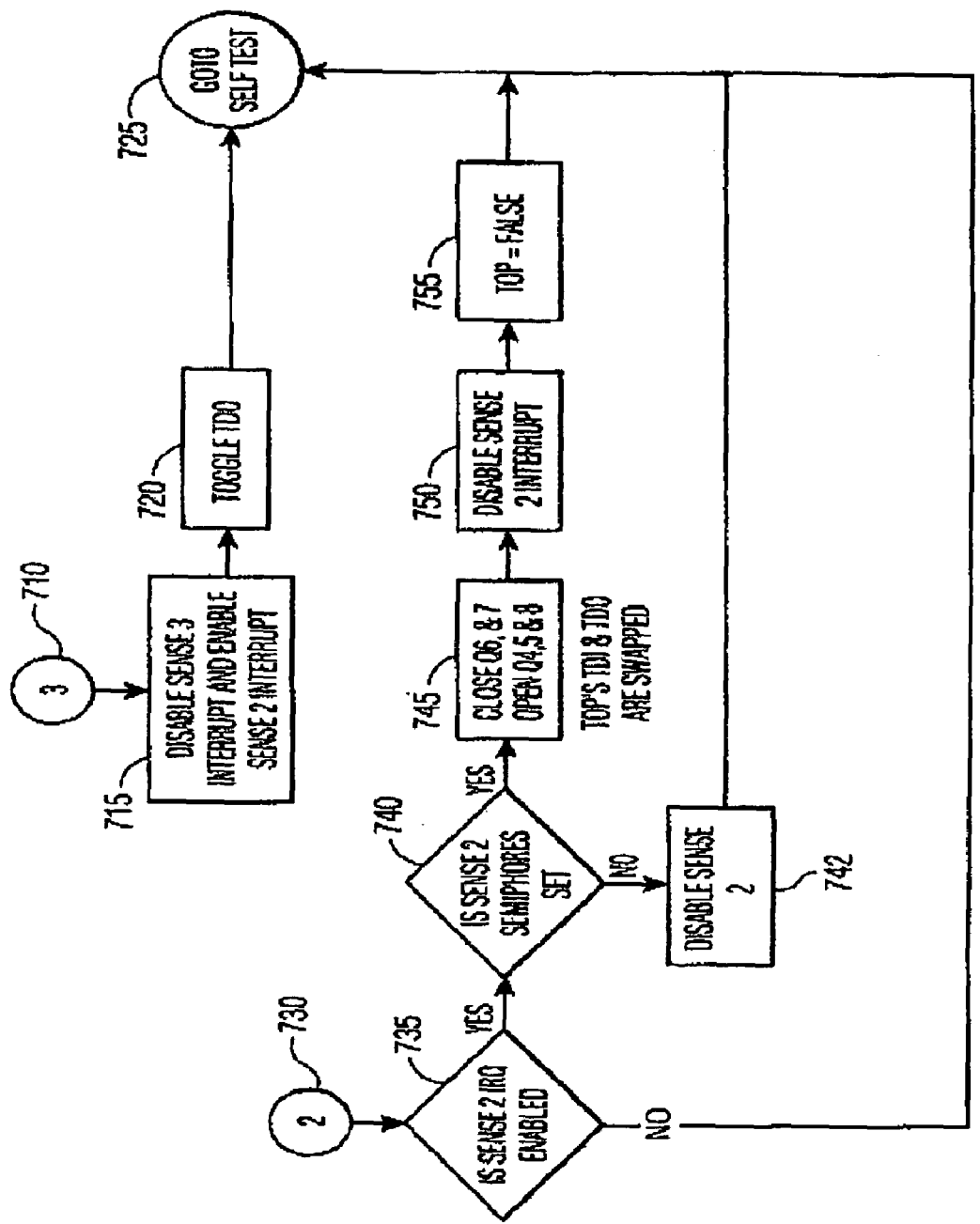
FIG. 7 is a flow diagram for a controlling switches and interrupt-detect signals for a configuration step of a hardware configuration approach, according to another example embodiment of the present invention.

FIGS. 6 and 7 show an approach for performing a JTAG signal check, according to another example embodiment of the present invention. The JTAG signal check approach may, for example, be performed in connection with the approach discussed in connection with node 417 in FIG. 4. In addition, the approaches in FIGS. 6 and 7 may also be implemented in connection with the interrupt routines discussed in connection with FIG. 5; by way of example, the approaches shown in FIGS. 6 and 7 are discussed in the context of the interrupt routines shown in FIG. 5.

At node 605, the JTAG signal check is initiated and, if the first semiphore is set, switches 804, 805 and 809 are closed, and switches 803, 806, 807 and 808 are opened at block 615. The sense interrupt for test node 836 is disabled at block 620, and an indicator of whether a JTAG-compatible circuit is coupled to test nodes 834 and 836 is set to FALSE (i.e., no JTAG-compatible circuit present) at block 625. A self-test is then initiated at node 630, for example, as discussed in connection with FIG. 3.

If the first semiphore is not set at node 610 the process proceeds to node 640, here shown detecting whether JTAG-compatible circuits are coupled above and below the circuit being tested, and whether the circuit being tested is a master circuit (i.e., controls JTAG signal passing on all three circuits). If the circuit being tested is not the master and is coupled to JTAG-compatible circuits above and below, the process proceeds to block 645. This determination is made at node 640 using, for example, indicators such as that set in block 625, after detecting the presence of additional JTAG-compatible circuits at test nodes 830 and 832, or at test nodes 834 and 836. At node 645, switches 803, 804, 809 and 812 are opened, and switches 801, 802, 804 and 810 are closed. A sense interrupt for test nodes 830 and 832 are disabled, test data out (TDO) signals are toggled at node 655 and an indicator that the circuit being tested is the master is set to TRUE at block 660. A self-test is then initiated at node 630.

If the three conditions set out at node 640 are not met, a determination is made at node 670 as to whether a sense interrupt for test node 830 is enabled. If the sense interrupt for test node 830 is not enabled, the process proceeds to scenario 2 at node 672, shown in FIG. 7 and discussed below. If the sense interrupt for test node 830 is enabled at node 670 and the semiphore for the sense interrupt for test node 830 is not set, the process proceeds to scenario 3 at node 677, shown in FIG. 7 and discussed below. If the sense interrupt for test node 830 is enabled at node 670 and the semiphore for the sense interrupt for test node 830 is set, the process proceeds to block 680, where switches 801,802, 805, 808 and 809 are closed, and switches 804, 806, 807 and 813 are opened. At block 685, all sense interrupts are disabled, an indicator that the circuit being tested is not the top JTAG-compatible circuit is set to false at block 690 and a self-test is initiated at node 630.

FIG. 7 shows implementations of scenarios 2 and 3 as discussed above in connection with FIG. 6. Scenario 2 is initiated at node 730. If the sense interrupt for test node 832 is not enabled at node 735, the process proceeds to a self test at node 725. If the sense interrupt for test node 832 is enabled at node 735 but a semiphore therefor is not set at node 740, the sense interrupt for test node 832 is disabled at block 742. The process then proceeds to a self test at node 725 (e.g., in connection with FIG. 3). If the sense interrupt for test node 832 is enabled and the semiphore therefor is set, switches 806 and 807 are closed and switches 804, 805 and 808 are opened at block 745 (i.e., to swap signals at test nodes 830 and 832). The sense interrupt for test node 832 is disabled at block 750, an indicator that the circuit being tested is not the top JTAG-compatible circuit is set to false at block 755, and a self-test is initiated at node 725.

Referring again to FIG. 7, scenario 3 is initiated at node 710, with the sense interrupt for test node 830 being disabled and the sense interrupt for test node 832 being enabled at block 715. Test data out (TDO) signals are triggered at block 720, and a self test is initiated at node 725.

Figure 8:
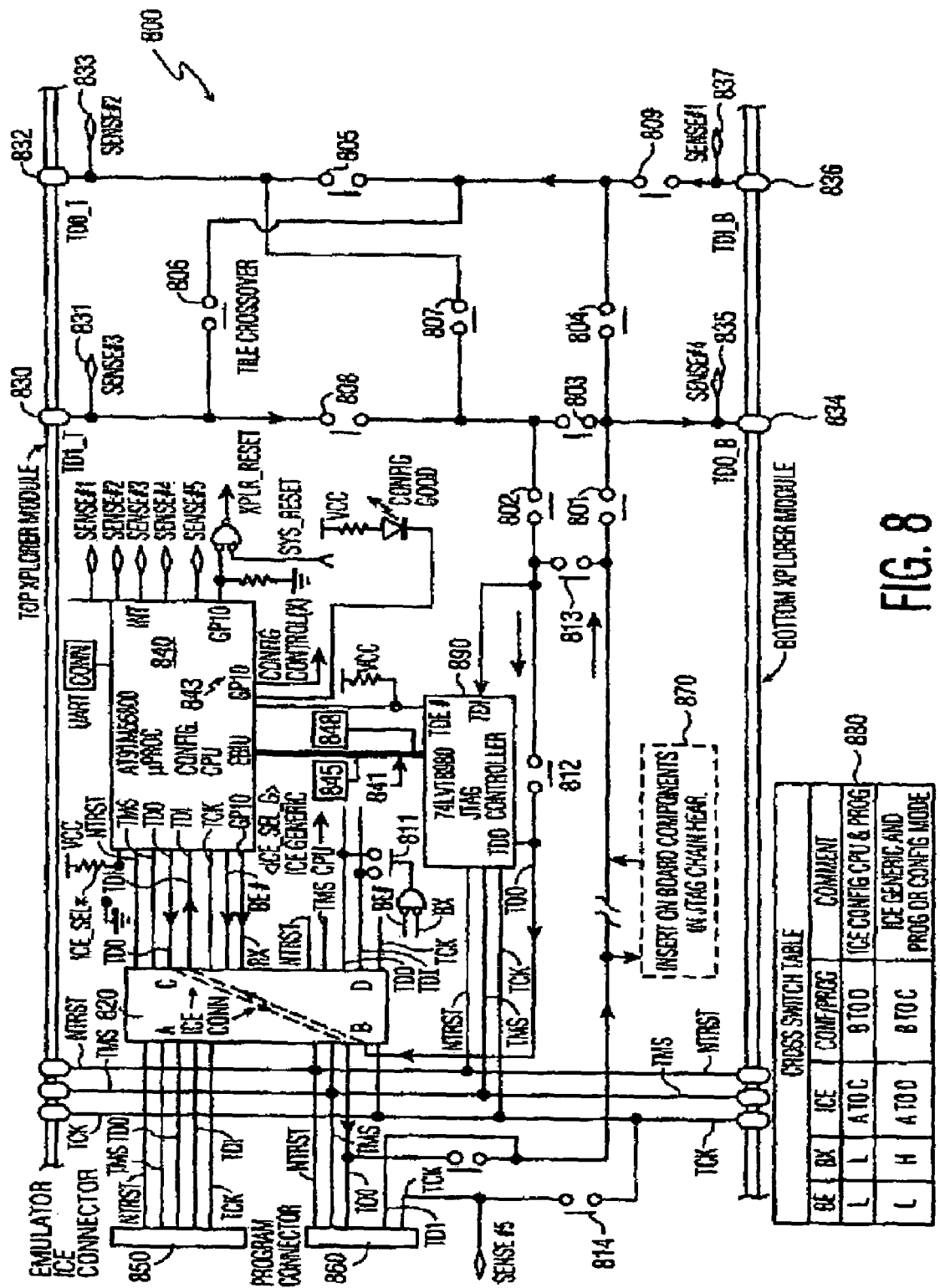
FIG. 8 is a circuit arrangement programmed for routing test signals in response to user-input controls received through a communications port, according to another example embodiment of the present invention.

FIG. 8 is a circuit 800 including a central processing unit (CPU) 840 (e.g., a microcontroller) coupled to test nodes 830, 832, 834 and 836, according to another example embodiment of the present invention. The CPU 840 is programmed with software for responding to an initialization routine and for running interrupt (alternatively, data-polling) routines for monitoring test data. The programming software is stored, for example, in a FLASH memory accessible by the CPU 840. For instance, a FLASH memory 845 coupled lo an external bus interface unit (EBIU) 841 may store the programming software. An RS232 communications link 848 is also coupled to the EBIU 841 and used for communicating between the CPU 840 and a user, for example, at a computer coupled to the RS232 communications link 848. Control signals, programming software and other signals are sent to the circuit 800 through the RS232 communications link 848, and monitored characteristics of the circuit 800 are also sent from the circuit 800 by way of the RS232 communications link. In response to monitored test data, the software operates the CPU 840 to control a plurality of switches 801–814 for routing test signals on the circuit 800 and to/from additional circuits coupled, for example, to one of the test nodes 830, 832, 834 and/or 836.

Test nodes 830 and 832 are TDI and TDO nodes, respectively, that are adapted for coupling to another circuit (e.g., a similar circuit stacked over the circuit 800). Test nodes 834 and 836 are TDI and TDO nodes, respectively, that are adapted for coupling to another circuit (e.g., a similar circuit stacked below the circuit 800). Test signals such as TCK, TMS, TDI and TDO are passed to one or more JTAG-compatible circuits 870 (e.g., CPUs or FPGAs). In addition, in the instance where one or more pairs of the test nodes 830, 832, 834 and 836 is coupled to another circuit, the test signals are passed to and from the other circuit.

The CPU 840 is coupled to a connector 820 by way of a first node C and to other circuitry and devices in the circuit 800. Node A at the connector 820 is coupled to an in-circuit emulator (ICE) connector 850, node B of the connector is coupled to both a program connector 860 and an on-circuit JTAG controller 890 and node D of the connector is optionally coupled to another CPU. The ICE connector 850 is adapted for coupling to an ICE, such as the "Majic" multi-processor advanced JTAG interface controller available from Embedded Performance, Inc. of Milpitas, Calif. Signals are applied to ICE connector 850 for emulation, such as in connection with the ARM 946ES RISC processor available from Arm, Inc. having a location in Redmond, Wash. The program connector 860 is adapted for coupling to a JTAG signal source, such as a tester or another stackable circuit, similar to the circuit 800, for supplying test signals to the circuit 800. The on-circuit JTAG controller 890 is also coupled to the CPU 840 by way of the EBIU 841 for communications therebetween.

The CPU 840 is adapted to be interrupted by test activity at the TDI and TDO nodes 830, 832, 834 and 836, with each node being tied lo one or more interrupt input ports of the CPU. The particular node at which test data is detected informs CPU 840 for controlling the switches 801–814 for routing the data to a particular test circuit path, as indicated by the particular (interrupting) node. For example, as discussed below, a variety of circuit paths on the circuit 800 as well as between the circuit 800 and other circuits can be selected using the switches 801-814.

Using the CPU 840, the switches 801-814 are controlled for coupling test inputs from one or more of a plurality of sources to JTAG-compatible circuits 870 and for routing data to and from JTAG-compatible components. In one instance, JTAG test inputs are coupled to the circuit 800 from an external tester, such as an ICE coupled to ICE connector 850, a JTAG program device coupled to program connector 860 or from another circuit (i.e., with input/outputs coupled to the test nodes 830 and 832 or the test nodes 834 and 836). In another instance, JTAG testing is carried out on the circuit 800 using the on-circuit JTAG controller 890.

For example, when the CPU 840 detects a signal at the program connector 860, switch 810 is controlled (open) so that a TDI signal from the program connector 860 is sent to the JTAG-compatible circuits 870. In addition, switch 814 is closed to couple a TCK signal from the program connector 860 to the circuit 800. When no signal is detected at the program connector 860 (or when connection to the program connector is not desired), switch 810 is controlled (closed) to couple a test signal from node B of the connector 820 to the JTAG-compatible circuits 870. Switch 814 is also correspondingly opened such that a TCK signal from the program connector 860 is not coupled to the circuit 800.

In another example, when the CPU 840 detects a signal at the input nodes 830 and 832, a test input signal from node 830 is coupled to one or more of the JTAG-compatible circuits 870 with the closing of switches 808, 802 and 812. Switches 813 and 803 are set open, and an output from the JTAG-compatible circuits 870 is coupled for output from the circuit 800 (e.g., through test node 832, with switches 804 and 805 also being closed and with switch 809 being open).

In another example, the CPU controls the switches such that a signal is provided to the TDO node 834 and monitors TDI node 836. When a signal is detected at TDI node 836, the CPU 840 sets switches 804 and 803 open and switch 809 closed for routing output test data from the circuit 800 to a circuit coupled to test nodes 834 and 836.

In another example embodiment, the on-circuit JTAG controller 890 is implemented for a stand-alone JTAG test implementation. In this example, switches 810 and 813 are closed and at least switches 812, 814, 801 and 802 are opened. With this approach, signals from the on-circuit JTAG controller 890 are routed to the JTAG-compatible circuits 870, with an output therefrom being routed back to the JTAG controller 890.

In one particular implementation, and referring again to FIG. 8, two circuit boards (upper and lower) containing IEEE 1149.1 JTAG compatible devices, similar to the circuit 800 shown in FIG. 8, are stacked together. Fur instance, such an arrangement may be implemented in a manner similar to that discussed in connection with upper IC 150 and lower IC 160 in FIG. 1. The following discussion is directed to the upper and lower boards having elements similar to those shown in FIG. 8, with corresponding discussion of the elements in FIG. 8 for both of the upper and lower boards having an upper or lower indicator in brackets. For instance, each of the upper and lower boards include node 830, with node 830 on the upper board being designated as "node 830 (upper board)" and node 830 at the lower board being designated as "node 830 (lower board)."

The upper one of the circuit boards is coupled to a JTAG programmer plugged into a program connector 860 (upper board). A TDI signal is sent out to the lower board at node 834 (upper board) and received at the lower board through a node 830 (lower board). The upper circuit board monitors a TDI node 836 (upper board) and detects a signal returning from the lower board through a TDO node 832 (lower board). In response to the detected signal, the CPU recognizes that the lower board is coupled to the upper board at nodes 834 (upper board) and 836 (upper board) and accordingly sets the switches (i.e., switch 809 is set closed and switch 304 is set open).

The various embodiments described above and shown in the figures are provided by way of illustration only and should not be construed to limit the invention. Based on the above discussion and illustrations, those skilled in the art will readily recognize that various modifications and changes may be made to the example embodiments of the present invention without strictly following the exemplary embodiments and applications illustrated and described herein. For example, as can be seen by the variety of switches 801-814 in FIG. 8, a plurality of combinations of open and closed switches can be used for routing data on the circuit 800 and to other circuits coupled to the circuit 800. Furthermore, one or more of the example embodiments discussed herein may be implemented in connection with the subject matter discussed in U.S. Provisional Patent Application Ser. No. 60/459294 entitled "Graphical User Interface and Approach Therefor" and in U.S. Provisional Patent Application Ser. No. 60/459327 entitled "Circuit Configurator Arrangement and Approach Therefor," both of which are filed concurrently herewith and fully incorporated herein by reference. These approaches are implemented in connection with various example embodiments of the present invention. Such modifications and changes do not depart from the true spirit and scope of the present invention that is set forth in the following claims.

What is claimed is:

1. A programmable circuit configurator having an interface for coupling to a target circuit device and having dedicated test-signal circuitry for testing a configured circuit that includes the target circuit device, the programmable circuit configurator comprising:

routing circuitry on the configured circuit having configurable test signal routing paths with controllable switches therein for coupling test signals between the dedicated test-signal circuitry and the target circuit device via the interface;

a programmable microcontroller communicatively coupled to the routing circuitry, the microcontroller being programmed to control the controllable switches and thereby configure the test signal routing paths; and a communications link adapted to communicatively couple an external user-controlled device and the programmable microcontroller for passing reconfiguration-control signals to the programmable microcontroller and for reporting characteristics of the configured test signal routing paths, the reconfiguration-control signals being communicatively coupled to the programmable microcontroller for reconfiguring the test signal routing paths, and wherein the microcontroller is separably operable from the configured circuit and programmed to monitor operational characteristics of the configured circuit prior to power-up of the configured circuit.

2. The programmable circuit configurator of claim 1, wherein the dedicated test-signal circuitry includes a test-data input port adapted to pass test data to the dedicated test-signal circuitry, a test-data output port adapted to pass test data from the dedicated test-signal circuitry, and a test-clock port.

3. The programmable circuit configurator of claim 1, wherein the configured circuit includes a plurality of JTAG signal path switches adapted to route JTAG signals on the configured circuit and between the configured circuit and other configured circuits coupled to the configured circuit, and wherein the microcontroller is programmed to configure the plurality of JTAG signal path switches.

4. The programmable circuit configurator of claim 1, wherein the microcontroller is programmed to switch the plurality of JTAG signal path switches in response to the reconfiguration-control signal received at the user-controlled device and sent to the microcontroller via the communication link.

5. The programmable circuit configurator of claim 1, wherein the microcontroller is programmed to monitor configure the position of JTAG signal path switches on the configured circuit when the configured circuit is not powered.

6. The programmable circuit configurator of claim 5, wherein the microcontroller is programmed to set the position of the JTAG signal path switches when the configured circuit is not powered.

7. The programmable circuit configurator of claim 1, wherein control inputs from the user-controlled device are stored in memory at the programmable circuit configurator and wherein the microcontroller is programmed to configure the test signal path switches using the control inputs stored in the memory.

8. A programmable circuit configurator having an interface for coupling to a target circuit device and having dedicated test-signal circuitry for testing a configured circuit that includes the target circuit device, the programmable circuit configurator comprising:
    routing circuitry on the configured circuit having configurable test signal routing paths with controllable switches therein for coupling test signals between the dedicated test-signal circuitry and the target circuit device via the interface;
    a programmable microcontroller communicatively coupled to the routing circuitry, the microcontroller being programmed to control the controllable switches and thereby configure the test signal routing paths; and
    a communications link adapted to communicatively couple an external user-controlled device and the programmable microcontroller for passing reconfiguration-control signals to the programmable microcontroller and for reporting characteristics of the configured test signal routing paths, the reconfiguration-control signals being communicatively coupled to the programmable microcontroller for reconfiguring the test signal routing paths, and
    wherein the microcontroller is programmed to perform diagnostic testing on the configured circuit when the configured circuit is not powered.

9. The programmable circuit configurator of claim 8, wherein the microcontroller is programmed to send information obtained from the diagnostic testing to a user via the communications link and the user-controlled device.

10. A hardware configurator arrangement comprising:
    a configured circuit having a plurality of controllable switches on the configured circuit communicatively coupled between at least two JTAG test nodes on JTAG signal paths and target circuit devices along the JTAG signal paths;
    a programmable microcontroller communicatively coupled to the configured circuit, programmed to monitor and control a plurality of operational characteristics of the configured circuit including the controllable switches and adapted to output data in response to the monitored operational characteristics;
    a user interface adapted to accept control inputs from a user and to provide the output data from the microcontroller to the user;
    a communications link configured and arranged to communicate the control inputs and the microcontroller output data between the microcontroller and the user interface;
    and the microcontroller being programmable by the control inputs received from the user interface and communicated via the communications link for monitoring and controlling the plurality of operational characteristics of the programmable microcontroller, including controlling the controllable switches for coupling test signals to the target circuit devices;
    wherein the microcontroller is programmed to automatically detect a test signal at one of the JTAG test nodes and, in response to an automatically detected test signal, to control the controllable switches to route data between at least one of the JTAG test nodes and at least one of the JTAG signal paths; and
    wherein the microcontroller is programmed to monitor the JTAG test nodes using an interrupt routine for automatically detecting test signals at the JTAG test nodes.

11. The hardware configurator arrangement of claim 10, wherein the microcontroller is programmed to control the controllable switches for routing JTAG test data between the configured circuit and another configured circuit.

12. The hardware configurator arrangement of claim 11, wherein said configured circuit is coupled to said other configured circuit such that physical access to the controllable switches is prevented.

13. The hardware configurator arrangement of claim 10, wherein the microcontroller is adapted to control operation of the configured circuit in response to control inputs from the user interface.

14. The hardware configurator arrangement of claim 10, wherein the microcontroller is adapted to control JTAG operation of the configured circuit in response to control inputs from the user interface.

15. For use in a prototype arrangement of inter-connectable circuit boards, each of the inter-connectable circuit boards having JTAG test signal routing switches, JTAG test nodes and at least two JTAG circuit paths, a configurator server comprising:
    memory adapted to store data including program software;
    a reprogrammable microcontroller on a first one of the inter-connectable circuit boards and communicatively coupled to the memory, the microcontroller being programmed to automatically configure the JTAG test signal routing switches in response to a signal detected from at least one of the JTAG test nodes for routing JTAG test signals along a JTAG circuit path on at least the first one of the inter-connectable circuit boards using data stored in the memory including the program software;
    wherein the microcontroller is programmed to perform an interrupt routine for detecting the signal from the at least one of the plurality of test nodes;
    and a communications link adapted to communicate control inputs from a user interface device to the microcontroller and to communicate outputs from the microcontroller to the user interface, the microcontroller being operable in response to the control inputs.

16. The configurator server of claim 15, wherein the microcontroller is adapted to set the JTAG test signal routing switches in response to the control inputs received from the user interface.

17. The configurator server of claim 15, wherein each of the inter-connectable circuit boards includes at least on JTAG input test node and at least one JTAG output test node and wherein the JTAG output test node of the first one of the inter-connectable circuit boards is coupled to a JTAG input test node of a second one of the inter-connectable circuit boards and wherein the microcontroller is programmed for automatically configuring the JTAG test signal routing switches to route JTAG test signals between the first and second inter-connectable circuit boards via the JTAG output and JTAG input test nodes.

* * * * *